(12) United States Patent
Kwon et al.

(10) Patent No.: US 11,444,437 B2
(45) Date of Patent: Sep. 13, 2022

(54) POWER SUPPLY APPARATUS

(71) Applicant: LS ELECTRIC CO., LTD., Anyang-si (KR)

(72) Inventors: Hyukil Kwon, Anyang-si (KR); Kwangkyu Hwang, Anyang-si (KR); Kwanseung An, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 0 days.

(21) Appl. No.: 17/276,900

(22) PCT Filed: Aug. 29, 2019

(86) PCT No.: PCT/KR2019/011030
§ 371 (c)(1),
(2) Date: Mar. 17, 2021

(87) PCT Pub. No.: WO2020/060061
PCT Pub. Date: Mar. 26, 2020

(65) Prior Publication Data
US 2021/0384711 A1    Dec. 9, 2021

(30) Foreign Application Priority Data
Sep. 20, 2018  (KR) .................. 10-2018-0112833

(51) Int. Cl.
*H02B 1/20* (2006.01)
*H02M 3/00* (2006.01)
(Continued)

(52) U.S. Cl.
CPC ................ *H02B 1/20* (2013.01); *H02J 9/062* (2013.01); *H02M 3/003* (2021.05); *H02M 7/003* (2013.01)

(58) Field of Classification Search
CPC ........ H02M 7/003; H02M 3/003; H02B 1/20; H02B 1/014; H02J 3/007; H02J 9/062
See application file for complete search history.

(56) References Cited

U.S. PATENT DOCUMENTS

2008/0259532 A1*  10/2008  Hughes .................. H02B 11/26
                                                           361/611
2011/0278934 A1   11/2011  Ghosh et al.
(Continued)

FOREIGN PATENT DOCUMENTS

CN          202883319 U       10/2014
CN          203883319 U       10/2014
(Continued)

OTHER PUBLICATIONS

International Search Report for related International Application No. PCT/KR2019/011030; report dated Mar. 26, 2020; (5 pages).
(Continued)

*Primary Examiner* — Jared Fureman
*Assistant Examiner* — Esayas G Yeshaw
(74) *Attorney, Agent, or Firm* — K&L Gates LLP (57) ABSTRACT

A power supply apparatus includes a plurality of power modules for receiving alternating current power to provide the power to a load; an uninterruptible supply module to supply self-power to the load; an inverter module installed on one side of the power modules or the uninterruptible supply module to convert the power and provide converted power to the load; direct current bus bars provided inside enclosures of the power modules, the uninterruptible supply module, and the inverter module, respectively; and a connection bus bar for connecting adjacent direct current bus bars, wherein in the power modules and the uninterruptible supply module, an alternating current/direct current converter or a direct current/direct current converter is provided in the upper portion of the direct current bus bar, or the
(Continued)

alternating current/direct current converter or the direct current/direct current converter is provided in the lower portion of the direct current bus bar.

18 Claims, 8 Drawing Sheets

(51) Int. Cl.
*H02J 9/06* (2006.01)
*H02M 7/00* (2006.01)

(56) References Cited

U.S. PATENT DOCUMENTS

| | | | |
|---|---|---|---|
| 2012/0170175 A1 | 7/2012 | Silberbauer et al. | |
| 2014/0054964 A1 | 2/2014 | Edelen et al. | |
| 2015/0357773 A1 | 12/2015 | Schirmeier | |
| 2016/0172900 A1* | 6/2016 | Welch, Jr. | H05K 7/1492 307/64 |
| 2016/0380570 A1* | 12/2016 | Farr | H02P 1/04 318/504 |
| 2018/0090914 A1* | 3/2018 | Johnson | H02B 1/565 |
| 2018/0301930 A1* | 10/2018 | Gonzalez | H02J 3/46 |

FOREIGN PATENT DOCUMENTS

| | | |
|---|---|---|
| CN | 204130910 U | 1/2015 |
| JP | 08251781 A | 9/1996 |
| JP | 2000004512 A | 1/2000 |
| JP | 2000217273 A | 8/2000 |
| JP | 2002084766 A | 3/2002 |
| JP | 2004153883 A | 5/2004 |
| JP | 2010519890 A | 6/2010 |
| JP | 2011160647 A | 8/2011 |
| JP | 2013233044 A | 11/2013 |
| JP | 2018129961 A | 8/2018 |
| JP | 2018137893 A | 8/2018 |
| KR | 2000004622 A | 7/2000 |
| KR | 1020000046222 A | 7/2000 |
| KR | 201000138211 A | 12/2010 |
| KR | 1020100138211 A | 12/2010 |
| KR | 20120011262 A | 2/2012 |
| KR | 101220500 B1 | 1/2013 |
| KR | 20160093377 A | 8/2016 |
| KR | 20190096656 A | 8/2019 |
| WO | 2015128253 A1 | 9/2015 |
| WO | 2015145679 A1 | 10/2015 |
| WO | 2018100645 A1 | 6/2018 |

OTHER PUBLICATIONS

Written Opinion for related International Application No. PCT/KR2019/011030; report dated Mar. 26, 2020; (3 pages).
Korean Office Action for related Korean Application No. 10-2018-0112833; report dated Jan. 6, 2020; (5 pages).
Korean Notice of Allowance for related Korean Application No. 10-2018-0112833; report dated Jul. 29, 2020; (5 pages).
Extended European Search Report for related European Application No. 19862029.6; action dated Jun. 14, 2022; (4 pages).
Notice of Allowance for related Japanese Application No. 2021-512218; action dated May 10, 2022; (4 pages).

* cited by examiner

POWER SUPPLY APPARATUS

CROSS-REFERENCE TO RELATED APPLICATIONS

This application is the National Stage filing under 35 U.S.C. 371 of International Application No. PCT/KR2019/011030, filed on Aug. 29, 2019, which claims the benefit of earlier filing date and right of priority to Korean Application No. 10-2018-0112833, filed on Sep. 20, 2018, the contents of which are all hereby incorporated by reference herein in their entirety.

FIELD

The present disclosure relates to a power supply apparatus, and more particularly, to a power supply apparatus having a plurality of power supply modules.

BACKGROUND

In general, a power supply apparatus is an apparatus that receives alternating current power from a power source, converts the power into alternating current power or direct current power that can be used by a load, and supplies the converted power to the load. In a place where large scale facilities are provided or where power needs to be stably supplied, a power supply apparatus including a plurality of power supply modules is installed. Such a plurality of power supply modules may be connected through a direct current bus line (or a direct current bus bar). Here, the plurality of power supply modules may include an uninterruptible power supply (UPS).

Figure 1:
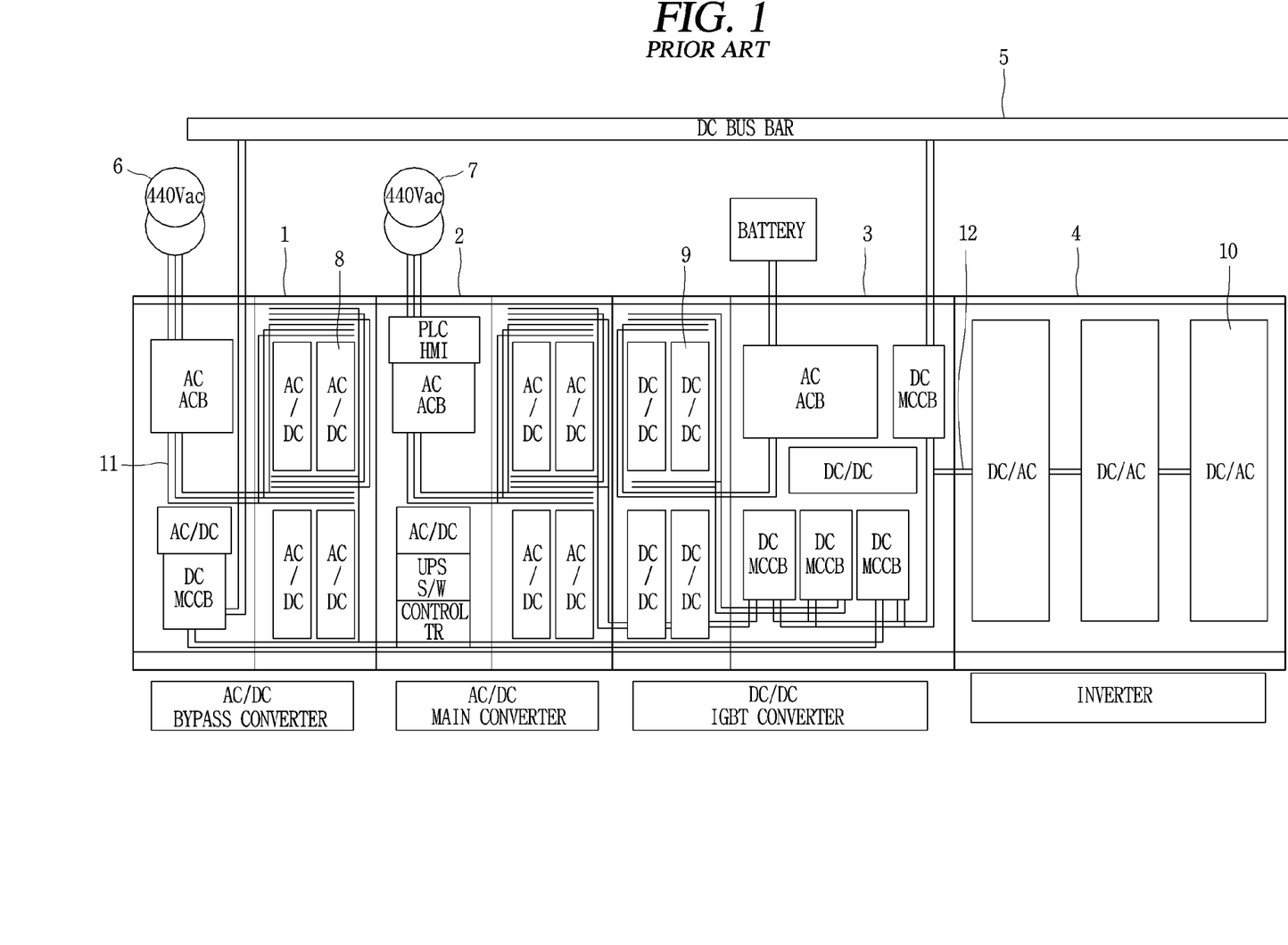
FIG. 1 is a view of a structure of a power supply apparatus according to the related art.

Referring to FIG. 1, a power supply apparatus according to the related art will be described as follows.

A power supply apparatus according to the related art includes a plurality of power supply modules arranged in a row. The plurality of modules includes, for example, a bypass module 1, a main module 2, a power semiconductor module 3, and an inverter module 4. A common bus bar 5 to provide direct current power is disposed above the plurality of modules to provide direct current power to each module.

The main module 2 and the bypass module 1 receive alternating current power from alternating current power sources 6 and 7, respectively. Meanwhile, the power semiconductor module 3 is provided as an uninterruptible supply module for supplying self-power in case of an emergency. The inverter module 4 is connected to a load to supply power to the load (not illustrated). In a normal state, the main module 2 supplies power received from the alternating current power source 7 to the load. When the main module 2 is not operable due to an accident or failure, the bypass module 1 supplies power received from the alternating current power source 6 to the load. When changing a power supply path from the main module 2 to the bypass module 1, the power semiconductor module 3 temporarily supplies power to the load in order to prevent a power failure.

Each module includes at least one of an alternating current/direct current converter 8 to convert alternating current into direct current, a direct current/alternating current converter 9 to convert direct current into alternating current, and a direct current/direct current converter 10 to elevate and lower direct current voltage. In addition, each module is provided with various power devices such as a circuit breaker, a control device, a programmable logic controller (PLC), or an uninterruptible power controller installed therein.

The various power devices and converters are usually configured as a two-stage structure in a module. In the module, a cable 11 or a bus bar 12 is complicatedly connected in connecting the power devices and the converters.

The power supply apparatus according to the related art has the following problems.

First, since the modules are arranged in a row, it is difficult to install the modules in a limited space. For example, when a length of the space is less than a length of an entire module, it is difficult to install a power supply apparatus in the space.

In addition, regarding an internal structure of the module, each module is configured as a two-stage structure, and various power devices and converters are disposed inside the module, and a common bus bar is disposed outside the module to supply current to each module. Between the common bus bar and modules, connection bus bars or connecting cables are used. The bus bars and cables are complicatedly entangled between power devices and converters, making assembly and installation as well as maintenance difficult.

SUMMARY

The present disclosure is to solve those problems, and an aspect of the present disclosure is to provide a power supply apparatus that can be disposed in a space with a limited length.

Another aspect is to provide a power supply apparatus that facilitates installation and maintenance by simplifying connection lines and devices inside a module.

A power supply apparatus according to an embodiment of the present disclosure includes: a plurality of power modules for receiving alternating current power to provide the power to a load; an uninterruptible supply module installed on one side of the plurality of power modules to supply self-power to the load; an inverter module installed on one side of the plurality of power modules or the uninterruptible supply module to convert power and provide the converted power to the load; direct current bus bars provided inside enclosures of the plurality of power modules, the uninterruptible supply module, and the inverter module, respectively; and a connection bus bar for connecting adjacent direct current bus bars, wherein in the plurality of power modules and the uninterruptible supply module, an alternating current/direct current converter or a direct current/direct current converter is provided above the direct current bus bar, or the alternating current/direct current converter or the direct current/direct current converter is provided under the direct current bus bar.

Here, the plurality of power modules includes a main module to supply power to the load in a normal state and a bypass module to supply power to the load when the main module is inoperable.

In addition, the power supply apparatus further includes a control module to control the plurality of power modules and the uninterruptible supply module.

In addition, the direct current bus bar is installed in an intermediate portion of each of the enclosures.

In addition, in the plurality of power modules and the uninterruptible supply module, when the alternating current/direct current converter or the direct current/direct current converter is provided above the direct current bus bar, rest of power devices are disposed under the direct current bus bar. And, in the plurality of power modules and the uninterruptible supply module, when the alternating current/direct current converter or the direct current/direct current converter is provided under the direct current bus bar, the rest of the power devices are disposed above the direct current bus bar.

In addition, the control module may be provided with an external direct current bus bar that is connected to the direct current bus bar provided in the control module and exposed outwardly of the control module.

In addition, the direct current bus bar may have longitudinal connection portions formed in a lengthwise direction at opposite end portions thereof, and a lateral connection portion formed in a widthwise direction at a side portion thereof.

In addition, the connection bus bar may have a coupling portion formed as a groove so that the longitudinal connection portion or the lateral connection portion is fastened thereto.

In addition, the coupling portion is a U-shaped groove or a stepped groove.

In addition, the power supply apparatus may further include outer frames disposed on edges of the enclosure and an intermediate frame disposed between the outer frames adjacent to each other.

In addition, one side surface of the outer frame may be provided with a cutout portion cut in a lengthwise direction, and another side surface facing the one side surface may be provided with a plurality of fastening holes aligned in the lengthwise direction.

In addition, the surface provided with the fastening holes may have a recessed stepped portion in the lengthwise direction.

In addition, opposite end portions of the outer frame may be provided with fastening grooves.

In addition, the power supply apparatus may further include a three-way frame connector to connect three outer frames adjacent to each other.

In addition, the three-way frame connector may include a body portion, and three fastening portions protruding from the body portion in three directions orthogonal to each other to be inserted in the fastening grooves.

In addition, opposite ends of the intermediate frame each may be provided with a fitting portion that is cut out.

In addition, the power supply apparatus may further include a one-way frame connector inserted into the fitting portion and fastened to the outer frame.

In addition, the one-way frame connector may include a stepped insertion portion to be inserted in the fitting portion, and an engaging surface portion provided with a screw hole and to be abutted on the outer frame.

In addition, the enclosure may be provided with a bus bar hole formed at a position where the longitudinal connection portion or the lateral connection portion is disposed.

In addition, the enclosure may be provided with a frame hole to expose a part of the outer frame.

With regard to the power supply apparatus according to each embodiment of the present disclosure, the power supply apparatus can be installed in a space with a limited length. In other words, a plurality of modules can be arranged in multiple rows in addition to a form in which a plurality of modules is arranged in a row. Further, modules can be arranged in different directions.

In addition, devices and bus bars inside the module are simply arranged to thereby facilitate maintenance.

Modules are standardized so as to be easily assembled and arranged in various configurations. In other words, appropriate modules are selected as needed so as to be connected, arranged, and used.

DETAILED DESCRIPTION

Hereinafter, preferred embodiments of the present disclosure will be described with reference to the accompanying drawings, but this is to explain in detail enough for those skilled in the art to easily implement the disclosure, and it does not mean that the technical idea and scope of the disclosure are limited thereto.

Figure 2:
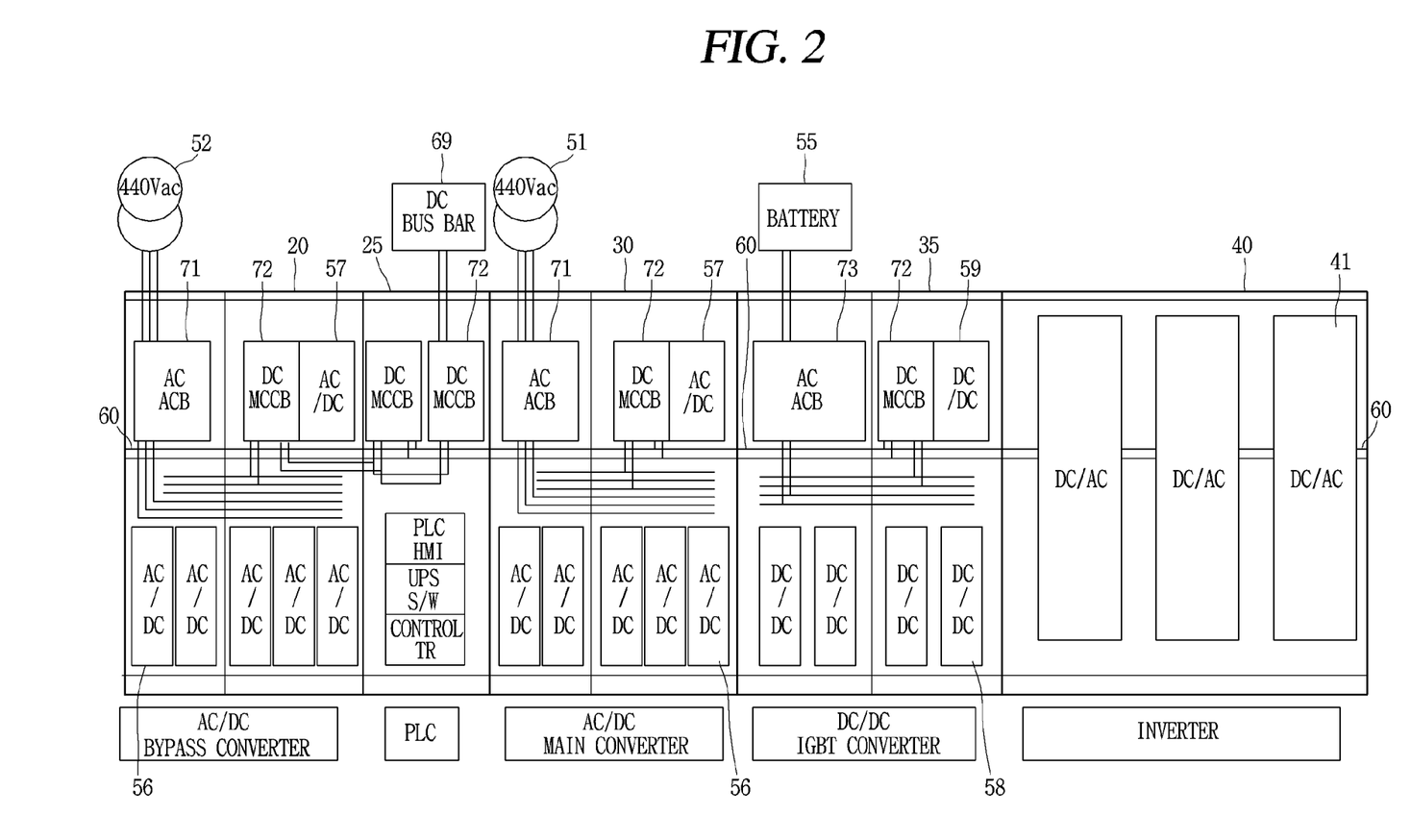
FIG. 2 is a view of a structure of a power supply apparatus according to an embodiment of the present disclosure.

FIG. 2 is a view of a structure of a power supply apparatus according to an embodiment of the present disclosure. Hereinafter, a power supply apparatus according to each embodiment of the present disclosure will be described in detail with reference to the drawings.

A power supply apparatus according to an embodiment of the present disclosure includes: a plurality of power modules 20 and 30 for receiving alternating current power to provide the power to a load; an uninterruptible supply module 35 installed on one side of the plurality of power modules 20 and 30 to supply self-power to the load; an inverter module 40 installed on one side of the plurality of power modules or the uninterruptible supply module 35 to convert power and provide the converted power to the load; direct current bus bars 60 provided inside enclosures of the plurality of power modules 20 and 30, the uninterruptible supply module 35, and the inverter module 40, respectively; and a connection bus bar 65 for connecting adjacent direct current bus bars 60, wherein in the plurality of power modules 20 and 30 and the uninterruptible supply module 35, an alternating current/direct current converter or a direct current/direct current converter is provided above the direct current bus bar 60, or the alternating current/direct current converter or the direct current/direct current converter is provided under the direct current bus bar.

A power supply apparatus according to an embodiment of the present disclosure includes a plurality of modules. Such a plurality of modules may include power modules 20, 30, and 35, an inverter module 40, and a control module 25. Here, the power modules 20, 30, and 35 may include a main module 30, a bypass module 20, and an uninterruptible supply module 35.

The main module 30 and the bypass module 20 receive alternating current power from alternating current power sources 51 and 52, respectively. In a normal state, the main module 30 supplies power received from a first alternating current power source 51 to a load (not illustrated). When the main module 30 is not operable due to an accident or failure, the bypass module 20 supplies power received from a second alternating current power source 52 to the load.

Meanwhile, the uninterruptible supply module 35 is provided to supply self-power in case of an emergency. The uninterruptible supply module 35 is also referred to as a power semiconductor module. The uninterruptible supply module 35 may be temporarily used to prevent power failure when a power supply path is changed between the main module 30 and the bypass module 20.

The inverter module 40 converts direct current power converted by the module into alternating current power, and supplies the converted power to the load.

Features of the present disclosure will be described in detail for each module.

The main module 30 is a device that receives alternating current power from a power source (the first alternating current power source 51) in a normal state, converts the alternating current power into direct current power, and supplies the direct current power to other modules or loads.

The main module 30 receives alternating current power from the first alternating current power source 51.

The main module 30 is provided with a first alternating current/direct current converter 56 and a second alternating current/direct current converter 57 to convert the alternating current power received from the first alternating current power source 51 into direct current power. The first alternating current/direct current converter 56 or the second alternating current/direct current converter 57 may be provided in plurality.

The main module 30 is provided with the direct current bus bar 60 to transmit the direct current power converted by the first alternating current/direct current converter 56. The direct current bus bar 60 is installed in an intermediate portion of the main module 30.

The main module 30 is provided with an alternating current circuit breaker 71 installed on an alternating current power line and a direct current circuit breaker 72 installed on a direct current power line in preparation for accidents in a transmission and distribution system such as overcurrent or ground fault. The alternating current circuit breaker 71 and the direct current circuit breaker 72 are disposed above the direct current bus bar 60 in the main module 30.

In the main module 30, the first alternating current/direct current converter 56 is disposed under the direct current bus bar 60.

In the main module 30, the first alternating current/direct current converter 56 is disposed under the direct current bus bar 60, and other power devices such as the circuit breakers 71 and 72 are disposed above the direct current bus bar 60. This arrangement is commonly applied to each module to enable standardization among modules, to facilitate assembly and installation, and to increase convenience in maintenance.

The bypass module 20 is a device that receives alternating current power from a power source (the second alternating current power source 52) when the main module 30 is unable to perform a normal energizing function, and converts the power into direct current power to supply the converted power to other modules or loads.

The bypass module 20 receives alternating current power from the second alternating current power source 52.

The bypass module 20 is provided with the first alternating current/direct current converter 56 and the second alternating current/direct current converter 57 to convert the alternating current power received from the first alternating current power source 52 into direct current power. The first alternating current/direct current converter 56 or the second alternating current/direct current converter 57 may be provided in plurality.

The bypass module 20 is provided with the direct current bus bar 60 to transmit the direct current power converted by the first alternating current/direct current converter 56. The direct current bus bar 60 is installed in an intermediate portion of the bypass module 20.

The bypass module 20 is provided with the alternating current circuit breaker 71 installed on the alternating current power line and the direct current circuit breaker 72 installed on the direct current power line in preparation for accidents in a transmission and distribution system such as overcurrent or ground fault. The alternating current circuit breaker 71 and the direct current circuit breaker 72 are disposed above the direct current bus bar 60 in the bypass module 20.

In the bypass module 20, the first alternating current/direct current converter 56 is disposed under the direct current bus bar 60.

In the bypass module 20, the first alternating current/direct current converter 56 is disposed under the direct current bus bar 60, and other power devices such as the circuit breakers 71 and 72 are disposed above the direct current bus bar 60. This arrangement is commonly applied to each module to enable standardization among modules, to facilitate assembly and installation, and to increase convenience in maintenance.

The control module 25 is provided to smoothly supply power to the load by controlling the power modules 20, 30, and 35 and externally transmit direct current power. The control module 25 is provided with various control devices or interface devices for controlling each module of the power supply apparatus installed therein. These apparatuses or devices include a programmable logic controller human machine interface (PLC HMI), an uninterruptible power supply switch (UPS S/W), and a control transmit-receive switch (TR).

The control module 25 is provided with the direct current bus bar 60 to transmit direct current power between modules. The direct current bus bar 60 is installed in an intermediate portion of the control module 25.

The control module 25 is provided with an external direct current bus bar 69 for transmission of direct current power between the power supply apparatus and the outside. The external direct current bus bar 69 is connected from the direct current bus bar 60 of the control module 25 and exposed outwardly of the control module 25.

The control module 25 is provided with the direct current circuit breaker 72 installed on the direct current power line in preparation for accidents in a transmission and distribution system such as overcurrent or ground fault. The direct current circuit breaker 72 are disposed above the direct current bus bar 60 in the control module 25.

The uninterruptible supply module 35 is provided to supply power to the load with its own power source. The uninterruptible supply module 35 is a temporary power supply module. For example, the uninterruptible supply module 35 is provided to prevent a power cut off (or disconnection) when a power supply line is changed from the main module 30 to the bypass module 20.

The uninterruptible supply module 35 receives power from a battery power source 55.

The uninterruptible supply module 35 includes a first direct current/direct current converter 58 and a second direct current/direct current converter 59 to elevate and lower direct current voltage received from the battery power source 55. The first alternating current/direct current converter 56 or the second alternating current/direct current converter 57 may be provided in plurality.

The uninterruptible supply module 35 is provided with the direct current bus bar 60 to transmit direct current power. The direct current bus bar 60 is installed in an intermediate portion of the uninterruptible supply module 35.

The uninterruptible supply module 35 is provided with the direct current circuit breaker 72 installed on the direct current power line in preparation for accidents in a transmission and distribution system such as overcurrent or ground fault. In addition, a second direct current circuit breaker 73 is provided between the battery power source 55 and the direct current power line. In addition, the direct current circuit breaker 72 and the second direct current circuit breaker 73 are disposed above the direct current bus bar 60 in the uninterruptible supply module 35.

In the uninterruptible supply module 35, the first direct current/direct current converter 58 is disposed under the direct current bus bar 60.

In the uninterruptible supply module 35, the first direct current/direct current converter 58 is disposed under the direct current bus bar 60, and other power devices such as the circuit breakers 71 and 72 are disposed above the direct current bus bar 60. This arrangement is commonly applied to each module to enable standardization among modules, to facilitate assembly and installation, and to increase convenience in maintenance.

The inverter module 40 is provided to convert direct current power converted by each module into alternating current power, and supply the alternating current power to the load. The inverter module 40 is provided with a plurality of inverters 41. The inverter 41 is connected to the main module 30, the control module 25, and the uninterruptible supply module 35, respectively. Power converted into alternating current in the inverter 41 is supplied to each load.

The inverter module 40 is provided with the direct current bus bar 60 to transmit direct current power supplied from each module.

Figure 3:
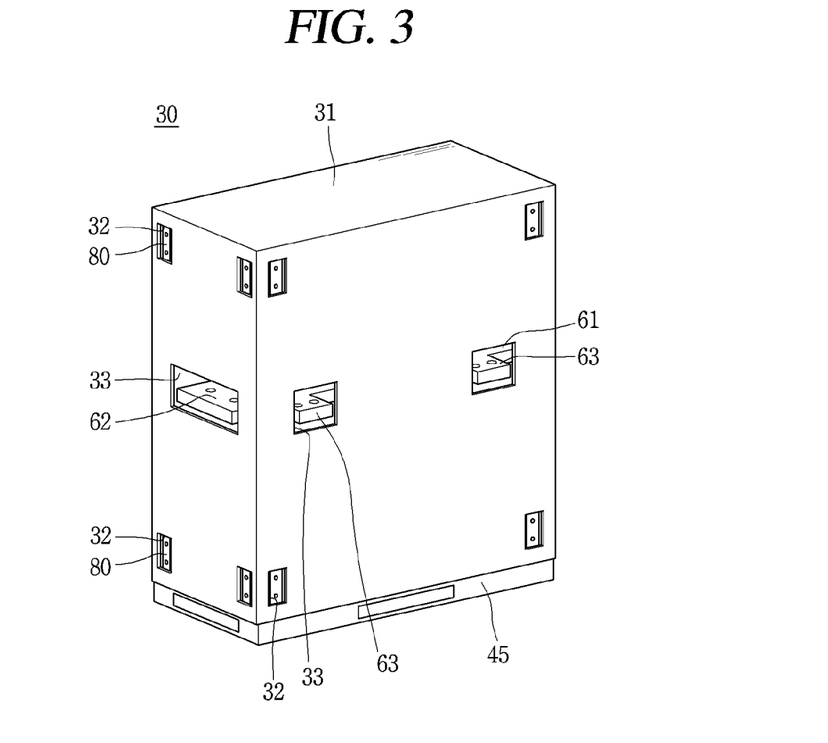
FIG. 3 is a perspective view of any one module of FIG. 2.
Figure 4:
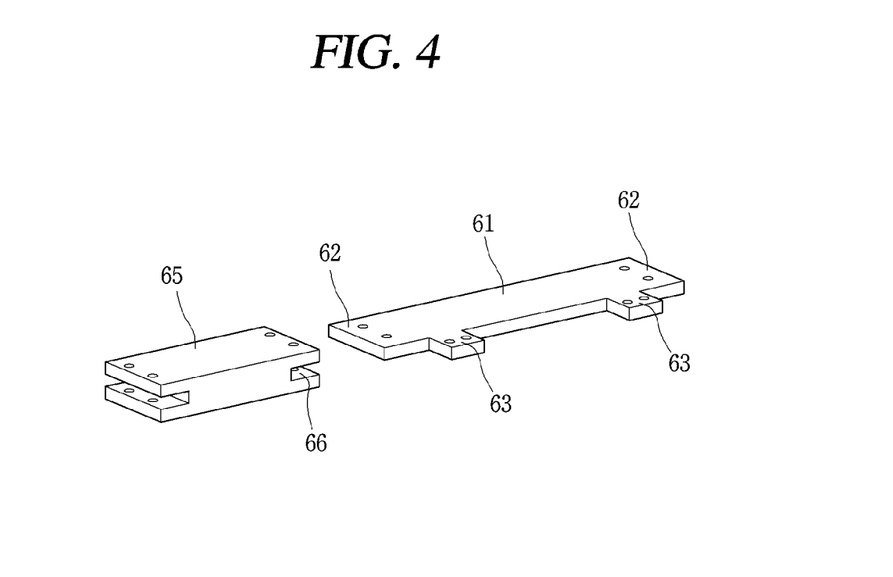
FIG. 4 is a perspective view of a direct current bus bar and a connection bus bar applied to a power supply apparatus according to an embodiment of the present disclosure.

FIG. 3 is a perspective view of a main module of FIG. 2, and FIG. 4 is a perspective view of a direct current bus bar and a connection bus bar applied to each module.

Each of the modules 20, 25, 30, 35, and 40 includes an enclosure and a frame as a structure. Since this is a matter that can be commonly applied to each module, the main module 30 will be described as an example. Unless otherwise specifically described and applied, the matters described below may be applied not only to the main module 30 but also to other modules.

The main module 30 has an enclosure 31 and frames 80, 85 and 45 as a structure. The enclosure 31 is provided to accommodate each electric power device. The frames 80, 85 and 45 include an outer frame 80 and an intermediate frame 85 provided in the enclosure 31, and a base frame 45 provided at a lower portion of the enclosure 31. Each of the frames 80, 85, and 45 may be selectively provided.

The enclosure 31 may be defined in a cabinet shape. A front surface of the enclosure 31 is provided with a door 34 (refer to FIG. 8), so that an interior thereof is accessible when opening the door 34. The enclosure 31 is supported by the base frame 45.

Opposite side surfaces and a rear surface of the enclosure 31 are each provided with a plurality of frame holes 32 through which the frames 80 and 85 may be exposed, and a plurality of bus bar holes 33 through which the direct current bus bar 61 may be exposed. The frame holes 32 may be formed at an upper end portion and a lower end portion of the enclosure 31, and the bus bar holes 33 may be formed at an intermediate portion of the enclosure 31.

The direct current bus bar 60 includes a first direct current bus bar 61 having a relatively long length, a second direct current bus bar 64 having a relatively short length, and a connection bus bar for connecting between the first direct current bus bar(s) 61 and/or the second direct current bus bar(s) 64. The first direct current bus bar 61 or the second direct current bus bar 64 may be installed inside the enclosure 31. For each module, a direct current bus bar suitable thereto is applied.

The first direct current bus bar 61 may be installed at an intermediate portion of the enclosure 31. Accordingly, the enclosure 31 may be divided into a first stage and a second stage with the first direct current bus bar 61 therebetween. The converter is disposed under the first direct current bus bar 61 (i.e., the first stage), and the rest of the power devices, such as a circuit breaker excluding the converter, are disposed above the first direct current bus bar 61 (i.e., the second stage). Of course, they may be disposed vice versa.

The first direct current bus bar 61 may be formed in a plate shape. Here, opposite end portions of the first direct current bus bar 61 have a longitudinal connection portion in a lengthwise direction, respectively. Meanwhile, a side portion of the first direct current bus bar 61 has a lateral connection portion 63 in a widthwise direction. The longitudinal connection portion 62 may be formed in a direction perpendicular to the lateral connection portion 63. The lateral connection portion 63 may be provided in plurality.

The second direct current bus bar 64 may be formed similarly to the first direct current bus bar 61. The second direct current bus bar 64 may be formed similarly to the first direct current bus bar 61 except that the lateral connection portion 63 may be provided in singularity.

A connection bus bar 65 is provided to connect the direct current bus bar 61 and the direct current bus bar 64 which are adjacent to each other. The connection bus bar 65 may be formed in a plate shape. Opposite ends of the connection bus bar 65 are each provided with a coupling portion 66 to which the direct current bus bars 61 and 64 are connected, respectively. The coupling portion 66 may be formed as a groove in which the connection portions 62 and 63 are received. Here, the coupling portion 66 may be formed in various shapes such as a U-shaped groove or a stepped groove.

The direct current bus bars 61 and 64 and the connection bus bar 65 may be fastened by screwing. Direct current power may be transmitted between modules or transmitted externally by the direct current bus bar 60 and the connection bus bar 65. In addition, since the direct current bus bar 60 is divided into the first direct current bus bar 61, the second direct current bus bar 64, and the connection bus bar 65 and installed inside the module, the modules can be independently disposed to thereby selectively configure the apparatus.

Figure 5:
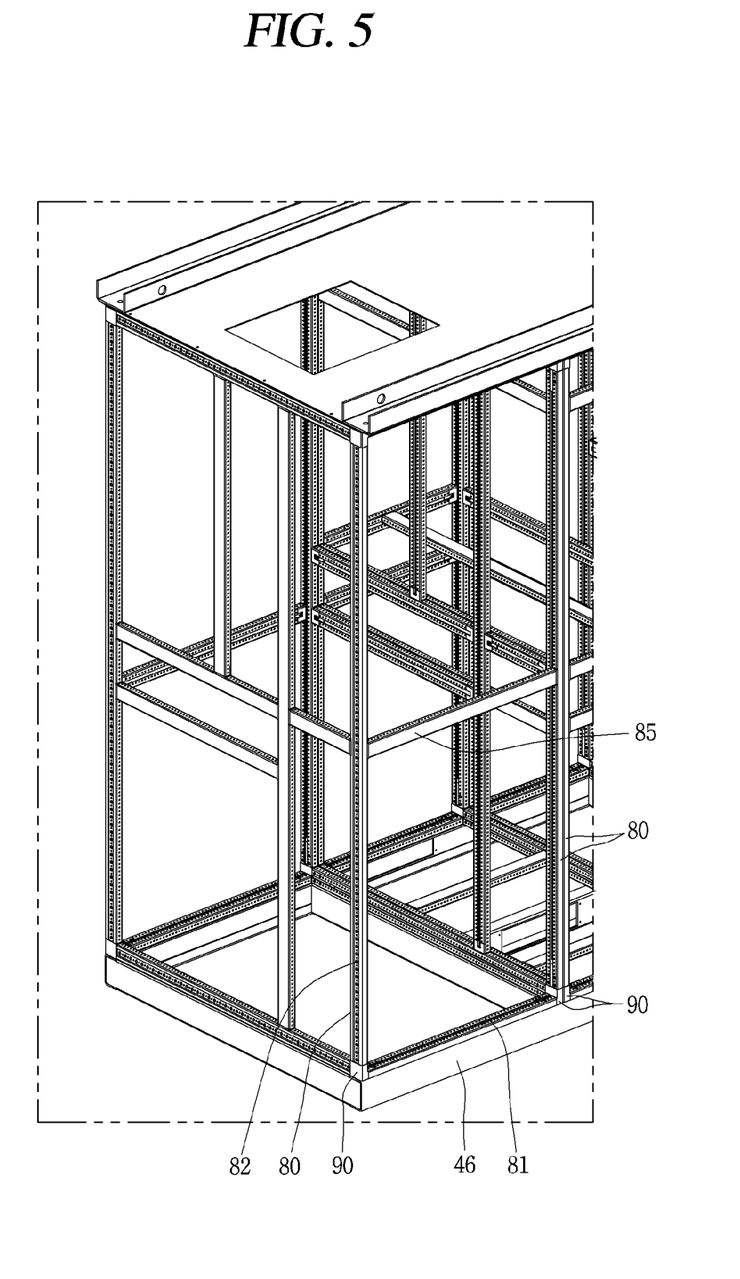
FIG. 5 is a perspective view of a module frame applied to a power supply apparatus according to an embodiment of the present disclosure.
Figure 6:
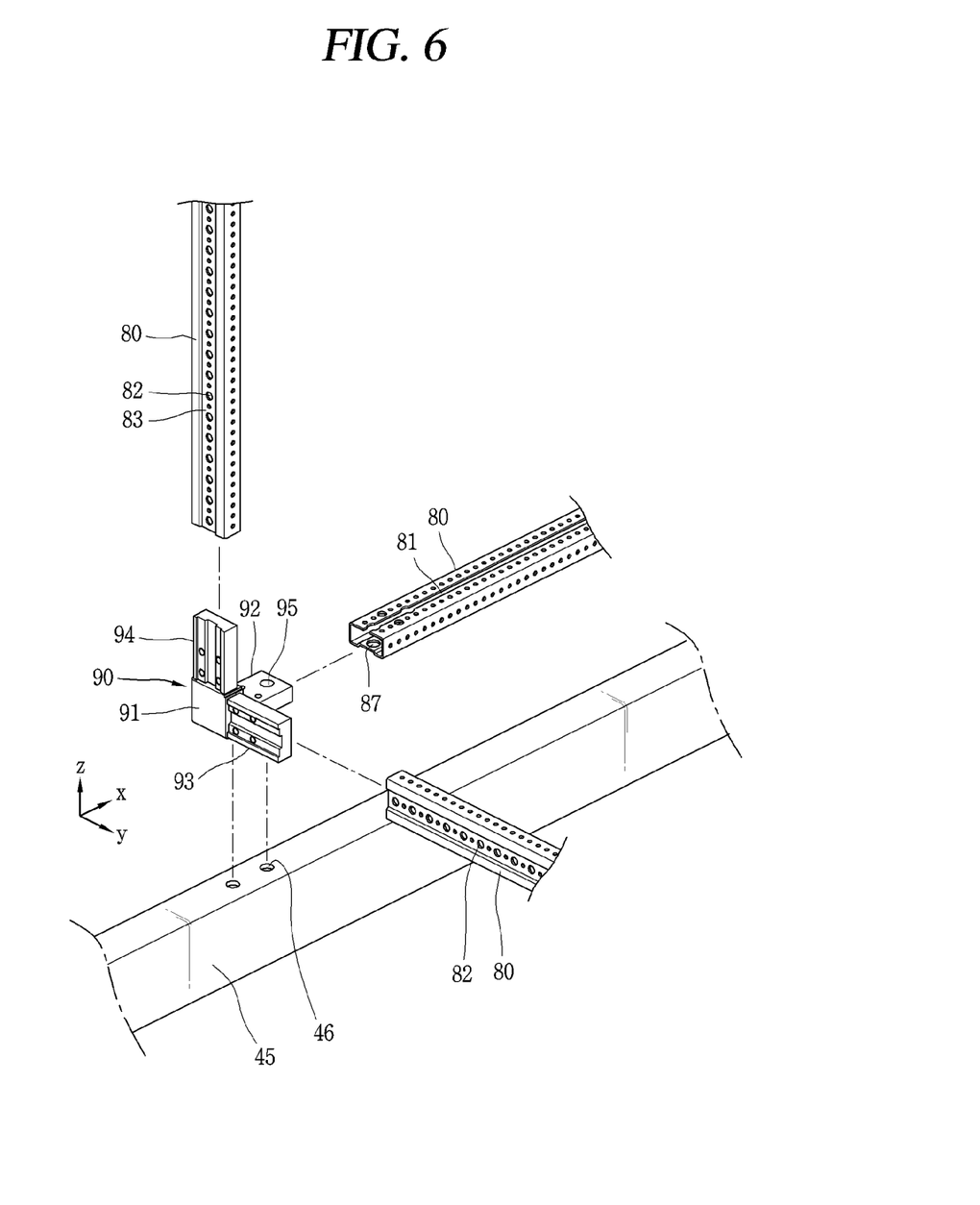
FIG. 6 is an exploded perspective view illustrating an outer frame of FIG. 5.
Figure 7:
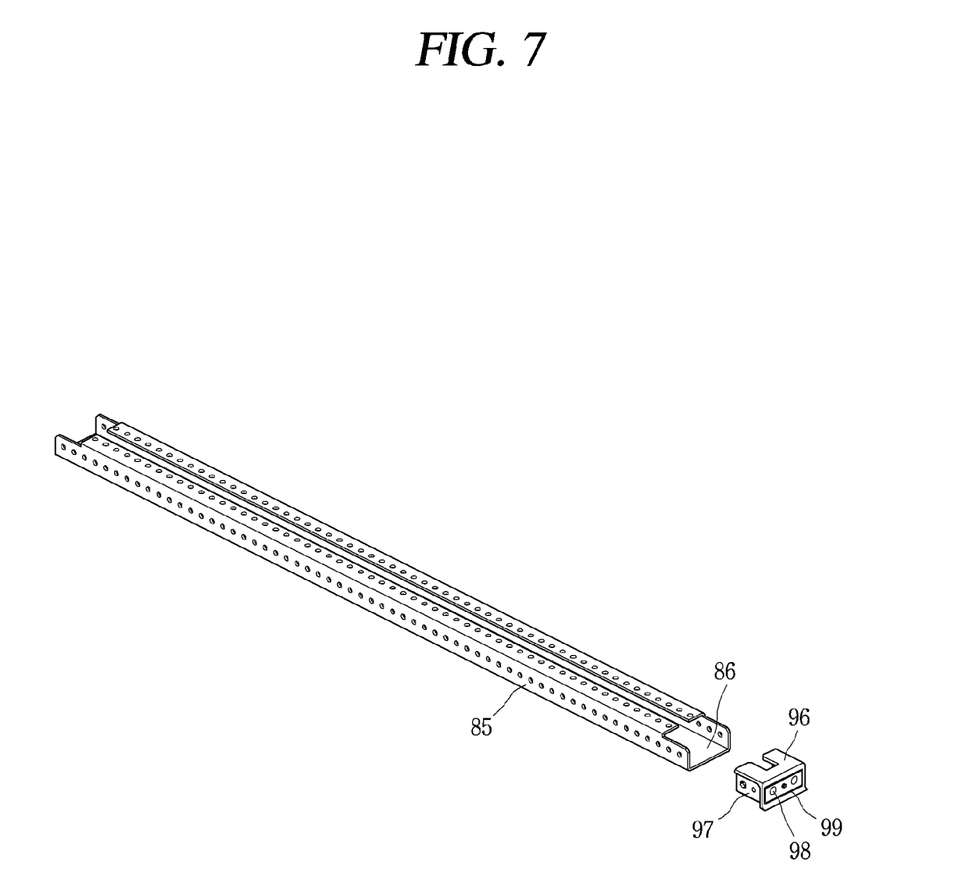
FIG. 7 is an exploded perspective view illustrating an intermediate frame of FIG. 5.

FIG. 5 is a perspective view of a module frame applied to a power supply apparatus according to an embodiment of the present disclosure, FIG. 6 is an exploded perspective view illustrating an outer frame of FIG. 5, and FIG. 7 is an exploded perspective view illustrating an intermediate frame of FIG. 5.

The frames 80, 85 and 45 include an outer frame 80 and an intermediate frame 85 provided in the enclosure 31, and a base frame 45 provided at a lower portion of the enclosure 31.

The base frame 45 is provided at the lower portion of the enclosure 31. The base frame 45 supports the module.

The outer frame 80 and the intermediate frame 85 are provided inside the enclosure 31.

The outer frame 80 is disposed on an edge of the enclosure 31 to support the enclosure 31. The outer frame 80 may have a straight line shape. A cross section of the outer frame 80 may have a rectangular shape, and a hollow portion may be formed inside the outer frame 80. The outer frame 80 has an appropriate length and is disposed in a horizontal direction or a vertical direction along the edge of the enclosure 31.

One side surface of the outer frame 80 has a cutout portion 81 cut in a lengthwise direction, and another side surface facing the one side surface has a plurality of fastening holes 82 aligned in the lengthwise direction. The surface where the fastening holes 82 are formed may have a recessed stepped portion 83 formed in the lengthwise direction. Fastening grooves 84 are formed at opposite end portions of the outer frame 80.

A three-way frame connector 90 is provided. The three-way frame connector 90 is provided to connect the outer frames 80. The three-way frame connector 90 includes a body portion 91, and fastening portions 92, 93, and 94 protruding from the body portion 91 in three directions orthogonal to each other. For example, each of the fastening portions 92, 93, and 94 may protrude in x, y, and z directions orthogonal to each other.

Each of the fastening portions 92, 93, and 94 of the three-way frame connector 90 is inserted in the fastening groove 84 of the outer frame 80. The outer frames 80 are connected to the three-way frame connector 90 to form a three-dimensional shape, and are installed on the edges of the enclosure 31 to support the enclosure 31.

A first fastening portion 92 of the three-way frame connector 90 has a coupling hole 95. In a state where the cutout portion 81 of the outer frame 80, the coupling hole 95 of the first fastening portion 92, and the fastening hole 46 of the base frame 45 are arranged in a straight line, the outer frame 80 is fixedly coupled to the base frame 45 by a screw that is fastened through the cutout portion 81, the coupling hole 95, and the fastening hole 46. Accordingly, the enclosure 31 is fixed to and supported by the base frame 45. For a portion where the base frame 45 is not applied, the outer frame 80 may be connected to the three-way frame connector 90 and fixed by screw fastening.

The intermediate frame 85 may be coupled between two outer frames 80. The intermediate frame 85 may be installed to reinforce a supporting force where a length of the outer frame 80 is formed long. Opposite ends of the intermediate frame 85 are each provided with a fitting portion 86 that is cut out.

A one-way frame connector 96 coupled to the fitting portion 86 is provided. The one-way frame connector 96 may have an approximately rectangular parallelepiped shape. The one-way frame connector 96 is fitted into the fitting portion 86 of the intermediate frame 85 and screwed to the outer frame 80.

The one-way frame connector 96 includes a stepped insertion portion 97 and an engaging surface portion 99 where a screw hole 98 is formed. The insertion portion 97 of the one-way frame connector 96 is inserted into the fitting portion 86 formed at opposite end portions of the intermediate frame 85, and the engaging surface portion 99 of the one-way frame connector 96 is coupled to the outer frame 80 with being abutted on the outer frame 80.

In the power supply apparatus having the above configurations, an arrangement form of each module is as follows.

Figure 8:
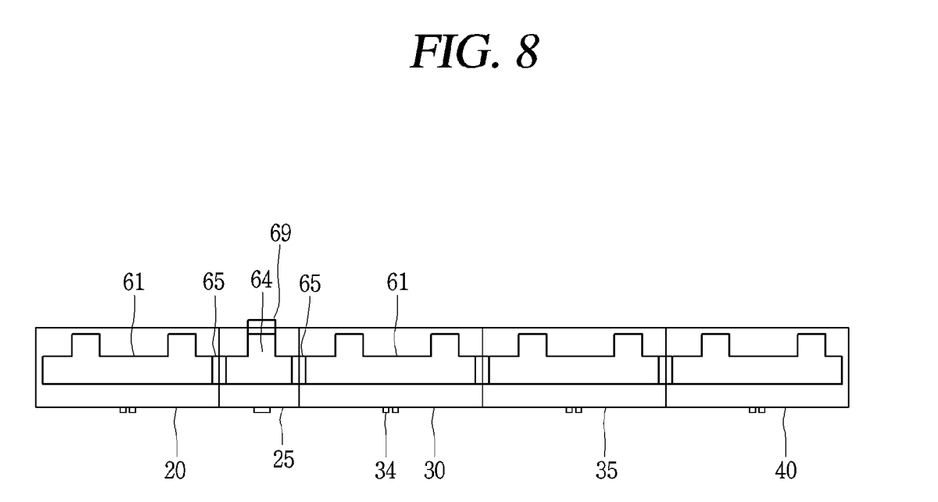
FIGS. 8 to 10 are planar views, which are layouts of a power supply apparatus according to each of embodiments of the present disclosure.

FIG. 8 is a planar view of a power supply apparatus according to an embodiment of the present disclosure. For convenience of understanding, only the enclosure and the bus bar are illustrated.

In this embodiment, the modules are arranged in a row. An example in which the bypass module 20, the control module 25, the main module 30, the uninterruptible supply module 35, and the inverter module 40 are sequentially arranged from left to right is illustrated. Here, it goes without saying that the arrangement order of the modules may be changed as needed.

A direct current bus bar 61 and a direct current bus bar 64 of adjacent modules are connected by a connection bus bar 65. The modules are connected such that longitudinal connection portions 62 of direct current bus bars 61 and 64 are connected by a connection bus bar 65.

Here, although not illustrated, two outer frames 80 brought into contact with each other between adjacent modules may be screwed together through the frame hole 32. This may increase a supporting force of the enclosure 31.

Figure 9:
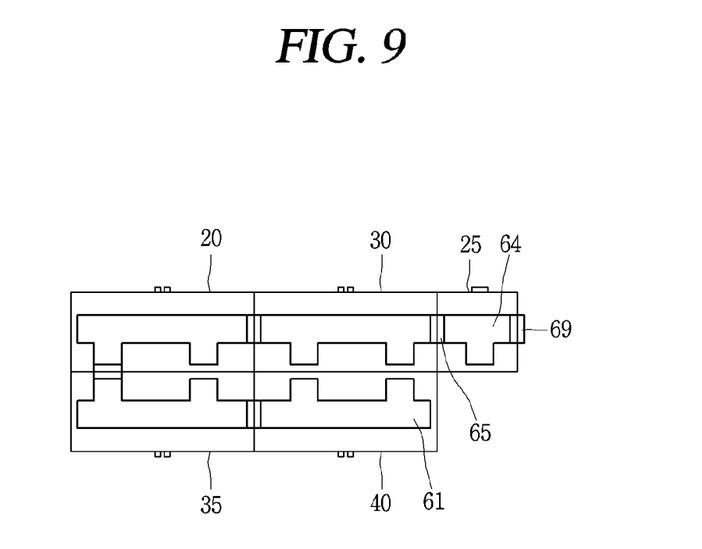

FIG. 9 is a planar view of a power supply apparatus according to another embodiment of the present disclosure.

In this embodiment, modules are arranged in two rows. Except for the control module 25, the remaining modules are arranged in two rows with rear surfaces thereof facing each other. Modules arranged in a same row are connected such that longitudinal connection portions 62 of direct current bus bars 61 are connected by a connection bus bar 65, and modules arranged in different rows and adjacent to (or facing) each other are connected such that lateral connection portions 63 of direct current bus bars 61 are connected by a connection bus bar 65.

According to the configuration in which the modules are arranged in a plurality of rows as described above, based on constant area occupied by the power supply apparatus, a length thereof is reduced. And therefore, the modules can be installed in a space limited in a lengthwise direction.

Figure 10:
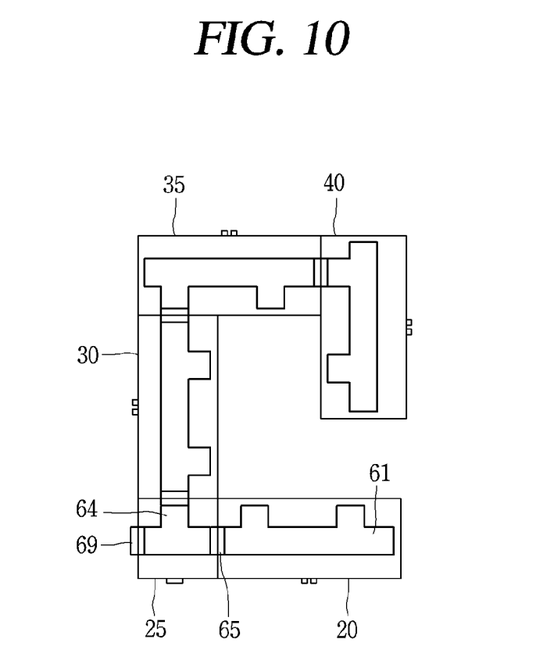

FIG. 10 is a planar view of a power supply apparatus according to still another embodiment of the present disclosure.

In this embodiment, modules are arranged to enclose a space in a central portion created by the arrangement of the modules. The modules may be arranged in such a manner that a side surface of a module is abutted on a rear surface of a module adjacent thereto. A longitudinal connection portion 62 of a direct current bus bar 61 of a module and a lateral connection portion 63 of a direct current bus bar 61 of a module adjacent thereto are connected by a connection bus bar 65. Since the power supply apparatus of this embodiment occupies a floor area in a shape close to a rectangle and creates an empty space in a central portion thereof, the power supply apparatus can be installed in a small space and provided with a work space for maintenance.

With regard to the power supply apparatus according to each embodiment of the present disclosure, the power supply apparatus can be installed in a space with a limited length. In other words, a plurality of modules can be arranged in multiple rows in addition to a form in which a plurality of modules is arranged in a row. Further, modules can be arranged in different directions.

In addition, devices and bus bars inside the module are simply arranged to thereby facilitate maintenance.

Modules are standardized so as to be easily assembled and arranged in various configurations. In other words, appropriate modules are selected as needed so as to be connected, arranged, and used.

The foregoing embodiments are to implement embodiments of the present disclosure. Therefore, those skilled in the art to which the present disclosure pertains various modifications and variations will be possible without departing from the essential characteristics of the present disclosure. Therefore, the embodiments disclosed in the present disclosure are not intended to limit the technical idea of the present disclosure but to describe the present disclosure, and the scope of the technical idea of the present disclosure is not limited by these embodiments. The true scope of the present disclosure should be interpreted by the following claims, and all technical ideas within the equivalent scope should be interpreted as being included in the scope of the present disclosure.

The invention claimed is:

1. A power supply apparatus, comprising:
a plurality of power modules for receiving alternating current power to provide the power to a load;
an uninterruptible supply module installed on one side of the plurality of power modules to supply self-power to the load;
an inverter module installed on one side of the plurality of power modules or the uninterruptible supply module to convert power and provide the converted power to the load;
direct current bus bars provided inside enclosures of the plurality of power modules, the uninterruptible supply module, and the inverter module, respectively; and
a connection bus bar for connecting adjacent direct current bus bars,
wherein in the plurality of power modules and the uninterruptible supply module, an alternating current/direct current converter or a direct current/direct current converter is provided above the direct current bus bar, or the alternating current/direct current converter or the direct current/direct current converter is provided under the direct current bus bar,
wherein the direct current bus bar has longitudinal connection portions formed in a lengthwise direction at opposite end portions thereof, and a lateral connection portion formed in a widthwise direction at a side portion thereof,
wherein the connection bus bar has a coupling portion formed as a groove so that the longitudinal connection portion or the lateral connection portion is fastened thereto.

2. The power supply apparatus of claim 1, wherein the plurality of power modules comprises a main module to supply power to the load in a normal state and a bypass module to supply power to the load when the main module is inoperable.

3. The power supply apparatus of claim 2, further comprising:
a control module to control the plurality of power modules and the uninterruptible supply module.

4. The power supply apparatus of claim 1, wherein the direct current bus bar is installed in an intermediate portion of each of the enclosures.

5. The power supply apparatus of claim 4, wherein in the plurality of power modules and the uninterruptible supply module, when the alternating current/direct current converter or the direct current/direct current converter is provided above the direct current bus bar, rest of power devices are disposed under the direct current bus bar, and
wherein in the plurality of power modules and the uninterruptible supply module, when the alternating current/direct current converter or the direct current/direct current converter is provided under the direct current bus bar, the rest of the power devices are disposed above the direct current bus bar.

6. The power supply apparatus of claim 3, wherein the control module is provided with an external direct current bus bar that is connected to the direct current bus bar provided in the control module and exposed outwardly of the control module.

7. The power supply apparatus of claim 1, wherein the coupling portion is a U-shaped groove or a stepped groove.

8. The power supply apparatus of claim 1, further comprising:
outer frames disposed on edges of the enclosure and an intermediate frame disposed between the outer frames adjacent to each other.

9. The power supply apparatus of claim 8, wherein one side surface of the outer frame is provided with a cutout portion cut in a lengthwise direction, and another side surface facing the one side surface is provided with a plurality of fastening holes aligned in the lengthwise direction.

10. The power supply apparatus of claim 9, wherein the surface provided with the fastening holes has a recessed stepped portion in the lengthwise direction.

11. The power supply apparatus of claim 8, wherein opposite end portions of the outer frame are provided with fastening grooves.

12. The power supply apparatus of claim 11, further comprising:
a three-way frame connector to connect three outer frames adjacent to each other.

13. The power supply apparatus of claim 12, wherein the three-way frame connector comprises a body portion, and three fastening portions protruding from the body portion in three directions orthogonal to each other to be inserted in the fastening grooves.

14. The power supply apparatus of claim 8, wherein opposite ends of the intermediate frame are each provided with a fitting portion that is cut out.

15. The power supply apparatus of claim 14, further comprising:
a one-way frame connector inserted into the fitting portion and fastened to the outer frame.

16. The power supply apparatus of claim 15, wherein the one-way frame connector comprises a stepped insertion portion to be inserted in the fitting portion, and an engaging surface portion provided with a screw hole and to be abutted on the outer frame.

17. The power supply apparatus of claim 1, wherein the enclosure is provided with a bus bar hole formed at a position where the longitudinal connection portion or the lateral connection portion is disposed.

18. The power supply apparatus of claim 8, wherein the enclosure is provided with a frame hole to expose a part of the outer frame.

* * * * *